(12) United States Patent
Song et al.

(10) Patent No.: US 8,681,025 B2
(45) Date of Patent: Mar. 25, 2014

(54) DATA ENCODING AND DECODING APPARATUS AND METHOD FOR COMMUNICATING BETWEEN ROBOT SOFTWARES

(75) Inventors: Byoung Youl Song, Daejeon (KR); Choulsoo Jang, Daejeon (KP); Seung-Woog Jung, Daejeon (KR); Sung Hoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/611,468

(22) Filed: Sep. 12, 2012

(65) Prior Publication Data

US 2013/0106625 A1 May 2, 2013

(30) Foreign Application Priority Data

Oct. 31, 2011 (KR) ........................ 10-2011-0112069

(51) Int. Cl.
*H03M 7/34* (2006.01)
(52) U.S. Cl.
USPC .............................................. 341/51; 341/50
(58) Field of Classification Search
USPC ..................................................... 341/50–51
See application file for complete search history.

(56) References Cited

U.S. PATENT DOCUMENTS

| 6,263,313 | B1 * | 7/2001 | Milsted et al. ................... 705/50 |
| 6,989,773 | B2 * | 1/2006 | Wee et al. ........................ 341/51 |
| 2010/0157057 | A1 | 6/2010 | Lim et al. |
| 2011/0142073 | A1 | 6/2011 | Jung et al. |
| 2011/0200125 | A1 | 8/2011 | Multrus et al. |

FOREIGN PATENT DOCUMENTS

| KR | 1020100072774 | 7/2010 |
| KR | 1020110038033 | 4/2011 |
| KR | 1020110066084 | 6/2011 |

* cited by examiner

*Primary Examiner* — Khai M Nguyen
(74) *Attorney, Agent, or Firm* — Nelson Mullins Riley & Scarborough LLP; Anthony A. Laurentano, Esq.; Dipti Ramnarain, Esq.

(57) ABSTRACT

A data encoding apparatus for communicating between robot softwares includes a meta structure converter factory configured to allow one or more meta structure converters generated based on an information file, and if a type of user data for encoding is a structure or a structure array, select a meta structure converter, operable to convert a structure of the user data into a meta structure, from among the registered meta structure converters; an encoder factory configured to allow encoders for respective types of data to be registered, and to select an encoder from among the registered encoders in order to encode the user data to be encoded; and an encoder unit configured to encode the user data to be encoded using the meta structure generated by the selected meta structure converter and the encoder.

16 Claims, 7 Drawing Sheets

FIG.6

STRUCTTOMETASTRUCTCONVERT FUNCTION()

```
Example)
UserClass *getUserClass_MetaStruct(MetaStruct *p)
{
    UserClass *x = malloc(sizeof(UserClass));

MetastructItem *pitem = p->list;
    x->a = pitem->u,i;
    pitem = pitem->next;
    x->b = pitem->u,d
    ......
}
```
— 600

STRUCTTOMETASTRUCTCONVERTER REGISTRATION CODE

```
Example)
Void setup()
{
    Register("UserClass", getUserClass_MetaStruct);
......
}
```
— 610

DATA ENCODING AND DECODING APPARATUS AND METHOD FOR COMMUNICATING BETWEEN ROBOT SOFTWARES

CROSS-REFERENCE TO RELATED APPLICATION(S)

The present invention claims priority of Korean Patent Application No. 10-2011-0112069, filed on Oct. 31, 2011, which is incorporated herein by reference.

FIELD OF THE INVENTION

The present invention relates to data encoding and decoding for communicating between robot softwares; and more particularly, to a data encoding and decoding apparatus and method for communicating between robot softwares, which are capable of encoding and decoding a variety of types of data and data of any type defined by the user regardless of the Operation System (OS) and the programming language in inter-robot software communication.

BACKGROUND OF THE INVENTION

In an XML scheme, ASN.1 and the like that are used as methods that encode data being used inside software into a type of data for communication when current robot software transmits data via communication, an encoder or a decoder is configured in accordance with a predetermined data structure. These methods have the problem of having to reconfigure an encoder/decoder when a new type is added, and the problem of the configuration of an encoder/decoder being difficult when sending a multiple array or a class having a complicated structure.

Recently, in order to overcome the above problems, "boost.org" presented a serialization library. Although the serialization library is flexible to any structure, it is difficult to use because errors occur in communication between Operating Systems (OSs), for example, between Windows and Linux.

Furthermore, it is difficult to use an encoding method generated by serialization in another language, such as C or Python because the encoding method is not disclosed.

SUMMARY OF THE INVENTION

In view of the above, the present invention provides a data encoding and decoding apparatus and method for communication between robot softwares, which are capable of encoding and decoding a variety of types of data and data of any type defined by the user regardless of the OS and the programming language in inter-robot software communication.

In accordance with a first aspect of the present invention, there is provided a data encoding apparatus for communicating between robot softwares, including: a meta structure converter factory configured to allow one or more meta structure converters generated based on an information file regarding one or more data structures to be registered therein, and if a type of user data for encoding is a structure or a structure array, select a meta structure converter, operable to convert a structure of the user data into a meta structure, from among the registered meta structure converters; an encoder factory configured to allow encoders for respective types of data to be registered, and to select an encoder from among the registered encoders in order to encode the user data to be encoded; and an encoder unit configured to encode the user data to be encoded using the meta structure generated by the selected meta structure converter and the selected encoder.

In accordance with a second aspect of the present invention, there is provided a data encoding method for communicating between robot softwares, including: generating one or more meta structure converters based on an information file regarding one or more data structures, and registering the meta structure converters in a meta structure converter factory; if a type of user data to be encoded is a structure or a structure array, converting a structure of the user data to be encoded into a meta structure using one of the meta structure converters registered in the meta structure converter factory; selecting a structure-type encoder from at least one or more previously registered encoders; and encoding the user data to be encoded using the structure-type encoder and the obtained meta structure.

In accordance with a third aspect of the present invention, there is provided a decoding apparatus for communicating between robot softwares, including: a user structure converter configured to allow one or more user structure converters based on an information file regarding one or more factory data structures to be registered therein, and to, if a type of encoded data is a structure or a structure array, select a user structure converter, operable to convert a meta structure of encoded data into a user structure, from among the registered user structure converters; a decoder factory configured to allow decoders to be registered for respective types of data, and to select a decoder from the registered decoders in order to decode the encoded data; and a decoder unit configured to decode the encoded data using a user structure generated by the selected user structure converter and the selected decoder.

In accordance with a fourth aspect of the present invention, there is provided a data decoding method for communicating between robot softwares, including: generating one or more user structure converters based on an information file regarding one or more data structures, and registering the user structure converters in a user structure converter factory; if a type of encoded data is a structure or a structure array, converting a meta structure of the encoded data into a user structure using one of the user structure converters registered in the user structure converter factory; and selecting a structure decoder from among one or more registered decoders.

In accordance with an embodiment of the present invention, an apparatus and method which are capable of easily encoding and decoding any user structure are provided by applying a variety of types of encoding rules, such as binary, XML and text, when configuring inter-robot software communication, thereby being able to encode and decode a variety of types of data and data of any type defined by the user regardless of the OS and programming language in inter-robot software communication.

BRIEF DESCRIPTION OF THE DRAWINGS

The objects and features of the present invention will become apparent from the following description of preferred embodiments given in conjunction with the accompanying drawings, in which:

FIG. 6 is a diagram illustrating the internal structure of a user structure converter in accordance with the embodiment of the present invention.

DETAILED DESCRIPTION OF THE EMBODIMENTS

Figure 1:
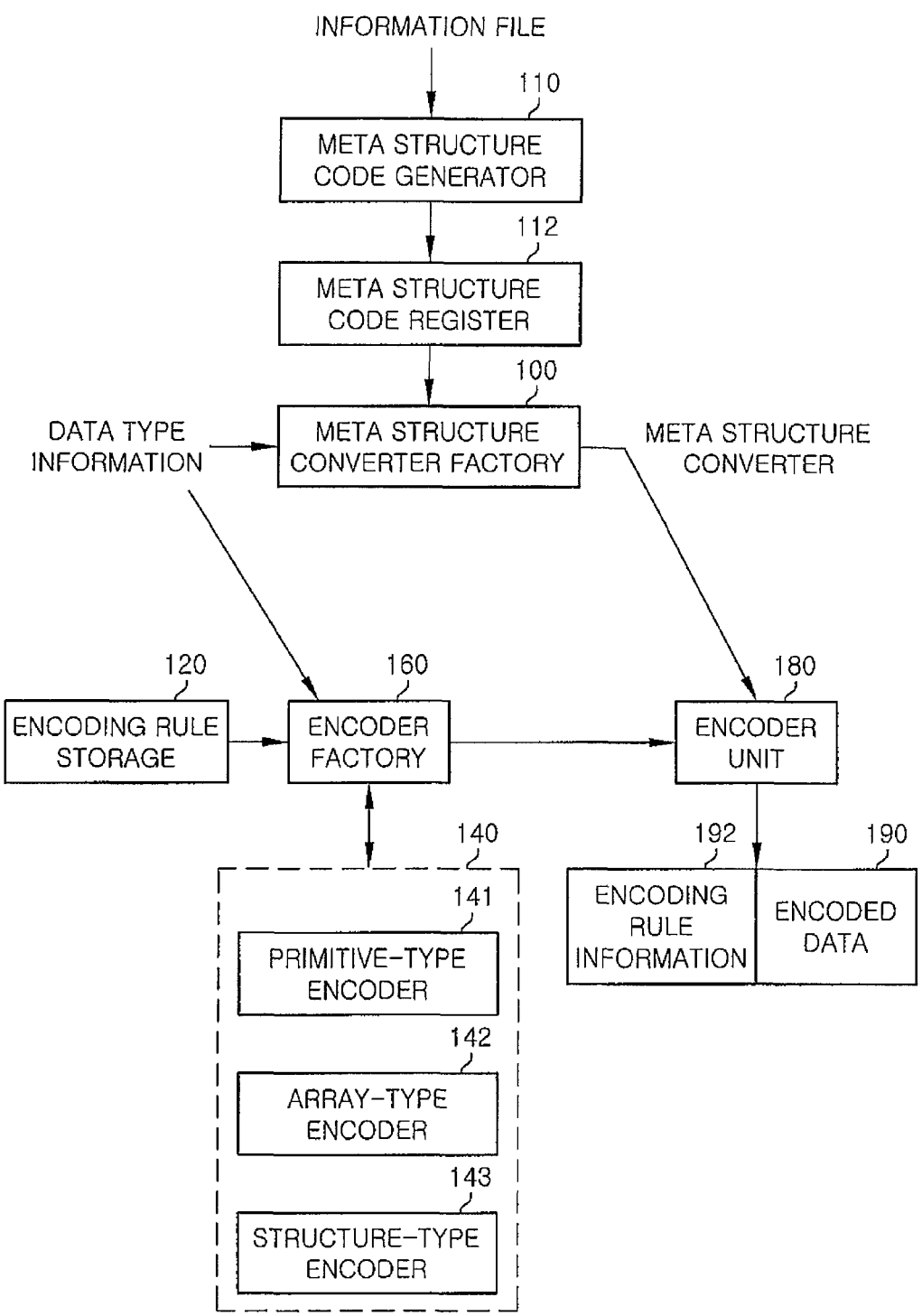
FIG. 1 is a block diagram of a data encoding apparatus for communicating between robot softwares in accordance with an embodiment of the present invention.

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms need to be defined throughout the description of the present invention.

Combinations of each step in respective blocks of block diagrams and a sequence diagram attached herein may be carried out by computer program instructions. Since the computer program instructions may be loaded in processors of a general purpose computer, a special purpose computer, or other programmable data processing apparatus, the instructions, carried out by the processor of the computer or other programmable data processing apparatus, create devices for performing functions described in the respective blocks of the block diagrams or in the respective steps of the sequence diagram. Since the computer program instructions, in order to implement functions in specific manner, may be stored in a memory useable or readable by a computer aiming for a computer or other programmable data processing apparatus, the instruction stored in the memory useable or readable by a computer may produce manufacturing items including an instruction device for performing functions described in the respective blocks of the block diagrams and in the respective steps of the sequence diagram. Since the computer program instructions may be loaded in a computer or other programmable data processing apparatus, instructions, a series of processing steps of which is executed in a computer or other programmable data processing apparatus to create processes executed by a computer to operate a computer or other programmable data processing apparatus, may provide steps for executing functions described in the respective blocks of the block diagrams and the respective sequences of the sequence diagram.

Moreover, the respective blocks or the respective sequences may indicate modules, segments, or some of codes including at least one executable instruction for executing a specific logical function(s). In several alternative embodiments, is noticed that functions described in the blocks or the sequences may run out of order. For example, two successive blocks and sequences may be substantially executed simultaneously or often in reverse order according to corresponding functions.

Hereinafter, embodiments of the present invention will be described in detail with reference to the accompanying drawings which form a part hereof.

An apparatus and method for encoding or decoding data when different robot software components or different pieces of application software send data via communication will be described below with reference to the accompanying drawings.

FIG. 1 is a block diagram of a data encoding apparatus for communicating between robot softwares in accordance with an embodiment of the present invention.

Referring to FIG. 1, the data encoding apparatus in accordance with the embodiment of the present invention may include a meta structure converter factory 100, a meta structure code generator 110, a meta structure code register 112, encoding rule storage 120, encoder storage 140, an encoder factory 160, and an encoder unit 180.

The meta structure converter factory 100 may allow one or more meta structure converters generated based on an information file regarding one or more data structures to be registered therein. If the type of user data to be encoded is a structure or a structure array, a meta structure converter may be selected from among the registered meta structure converters and then be provided to the encoder storage 140. Here, each of the meta structure converters is used to convert a user data structure into a meta structure, which will now described with reference to FIG. 2.

Figure 2:
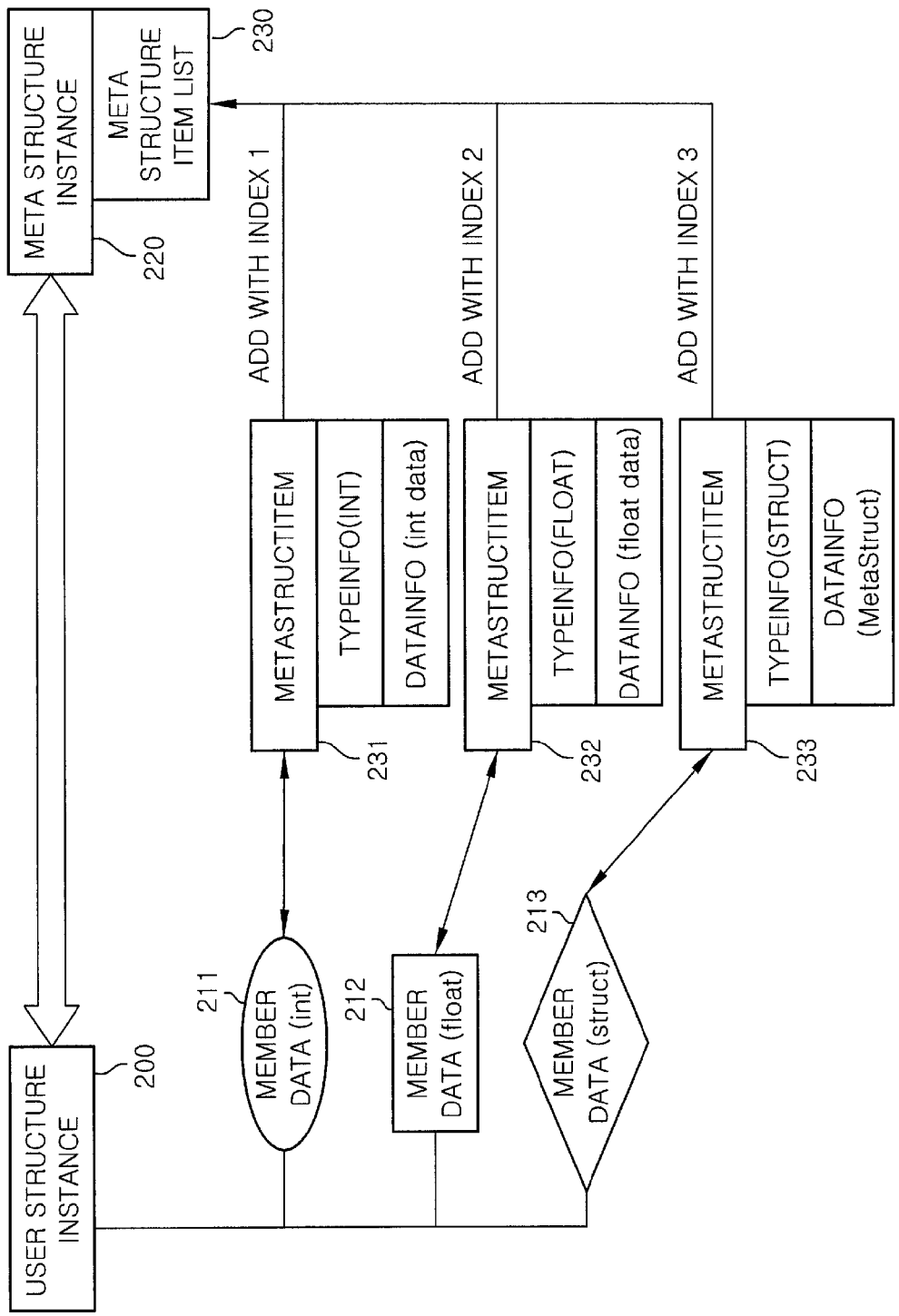
FIG. 2 is a diagram illustrating the process of conversion between a user structure and a meta structure in accordance with the embodiment of the present invention.

FIG. 2 is a diagram illustrating the process of conversion between a user structure and a meta structure in accordance with the embodiment of the present invention.

As shown in FIG. 2, integer-type member data 211, float-type member data 212 and structure-type member data 213 may be included in the user structure instance 200.

The meta structure converter generated by the meta structure converter factory 100 may generate a meta structure instance 220 using the generated user structure instance 200. Here, the meta structure instance 220 may include a meta structure item list 230 that is used to individually manage data about the individual pieces of member data in the user structure instance 200. The meta structure item list 230 may include a meta structure item 231 generated from the integer-type user structure member data 211, a meta structure item 232 generated from the float-type user structure member data 212, and a meta structure item 233 generated from the structure-type user structure member data.

Further, the meta structure converters registered in the meta structure converter factory 100 may be generated and registered by the meta structure code generator 110 and the meta structure code register 112.

The meta structure code generator 110 may generate a meta structure converter from an information file as the information file regarding a data structure defined by a user is input. The generated meta structure converter may be registered in the meta structure converter factory 100 by the meta structure code register 112.

Figure 3:
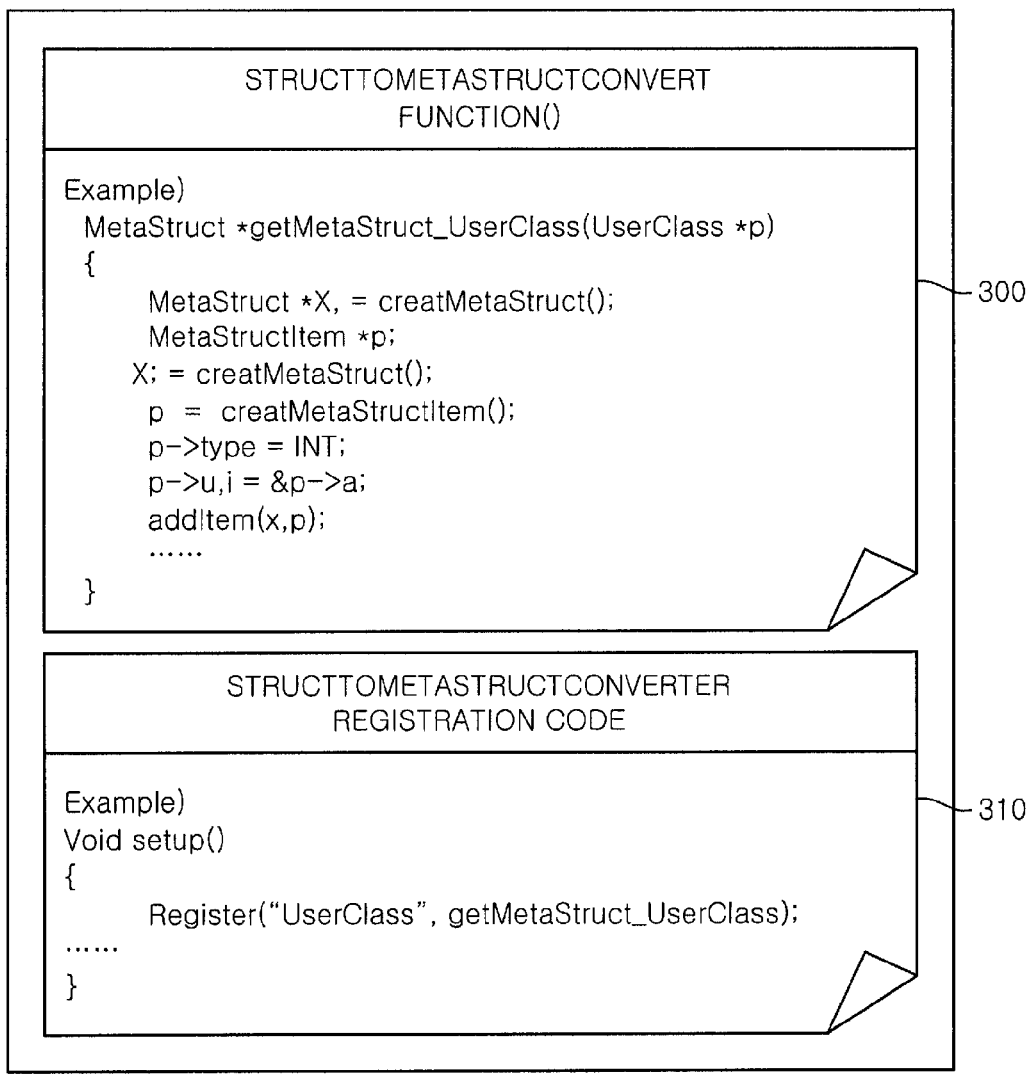
FIG. 3 is a diagram illustrating the internal structure of a meta structure converter in accordance with the embodiment of the present invention.

The meta structure converter generated by the meta structure code generator 110 may be implemented in the form of code, as shown in FIG. 3. That is, the meta structure converter may include a converter function code 300 for converting a user data structure into a meta structure and a registration code 310 for registering the converter function code 300.

The encoding rule storage 120 may store encoding rule information, e.g., a character string method, a binary method, and an XML method, that will be applied when user data is encoded.

In this embodiment of the present invention, the encoder storage 140 stores a primitive-type encoder 141, an array-type encoder 142, and a structure-type encoder 143.

The encoder factory 160 may be provided with encoding rule information, which will be used to encode user data, by the encoding rule storage 120, search for an encoder to be used from the encoder storage 140 using encoding rule information and information about the type of user data as arguments, select the encoder, and provided the encoder to the encoder unit 180. That is, when the type of user data to be encoded is a primitive type, the primitive-type encoder 141 is selected and generated. When the type of user data is an array type, the array-type encoder 142 is selected and generated. When the type of user data is a composite type such as a structure, the structure-type encoder 143 is selected and provided to the encoder unit 180.

The encoder unit 180 may encode user data using an encoder provided by the encoder factory 160. That is, when the type of user data to be encoded is a primitive type or an array type, the user performs encoding using the data as an argument. When the type of user data is a composite type such as a structure, encoding may be performed using a meta structure generated by a meta structure converter, and encoded data 190 may be output.

The encoder unit 180 may add the encoding rule information 192 to the encoded data 190, and then output the resulting data.

The operation of the data encoding apparatus for inter-robot application software communication, which is configured as described above, will be described with reference to FIG. 4.

Figure 4:
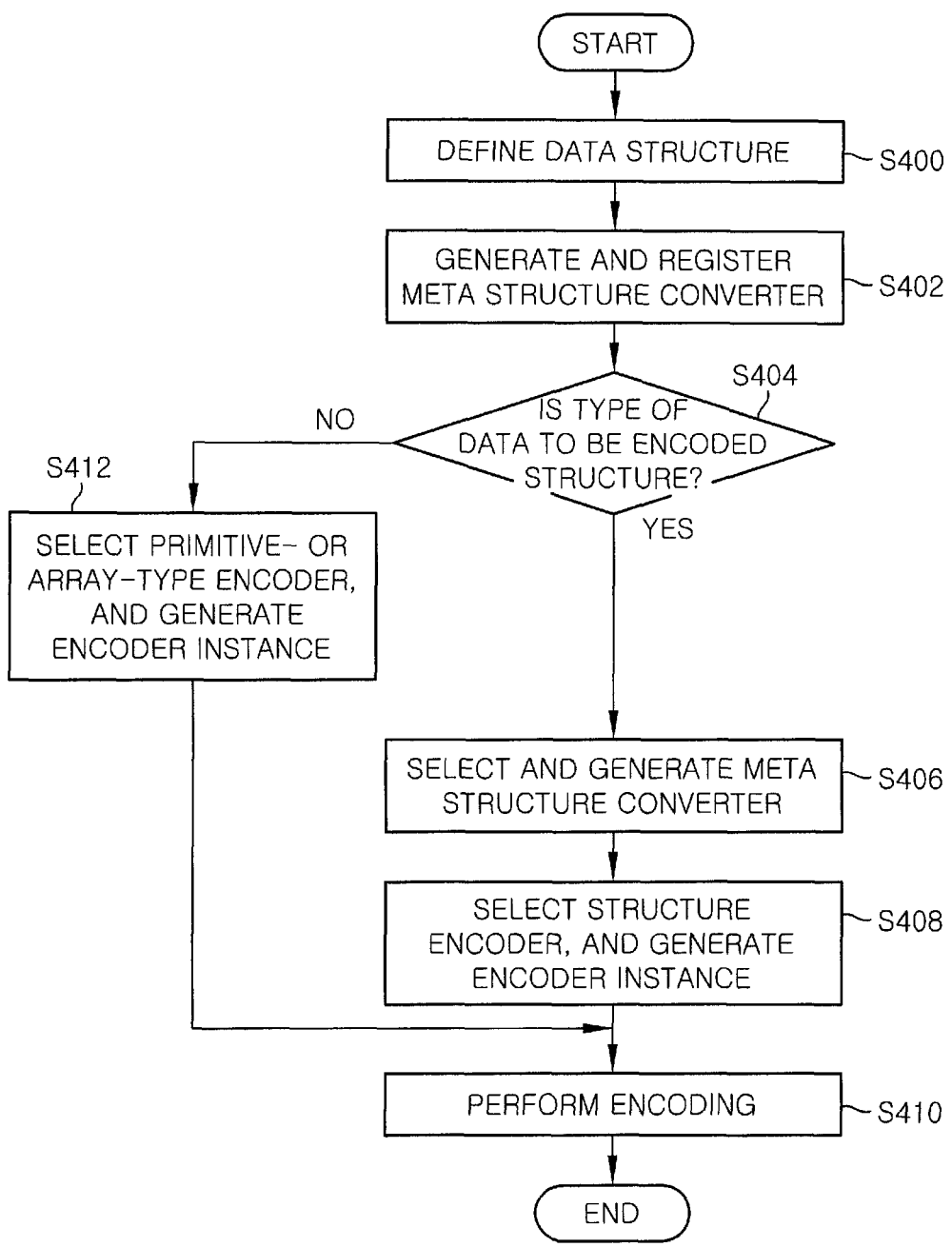
FIG. 4 is a flow chart showing the process of encoding data in accordance with the embodiment of the present invention.

FIG. 4 is a flow chart showing the process of encoding data in accordance with the embodiment of the present invention.

As shown in FIG. 4, in step S400, a user first may define a data structure to be used for encoding using a user interface provided by the encoding apparatus. Accordingly, the meta structure code generator 110 may generate codes for a meta structure converter while referring to an information file regarding a data structure that was defined through the user interface.

Thereafter, in step S402, prior to initiating encoding, the encoding apparatus may call the meta structure code register 112 and register the meta structure converter for each type of data in the meta structure converter factory 100.

Thereafter, data encoding may be performed at the same time that execution is performed. First, in step S404, the encoding apparatus may determine whether the type of data to be encoded is a structure.

If it is determined that the type of data to be encoded is a structure in step S404, information about the structure of the data to be encoded may be provided to the meta structure converter factory 100 and the meta structure converter factory 100 selects and generates a meta structure converter that performs the function of converting the type of data to be encoded into a meta structure in step S406. The generated meta structure converter may convert the type of data to be encoded into a meta structure and then provide it to the encoder unit 180. In other words, the meta structure converter may convert the type of data to be encoded into a meta structure in such a manner that the meta structure converter generates a meta structure item for each piece of member data of a data structure instance to be encoded and adds the meta structure item to the meta structure item list of the meta structure instance.

Thereafter, in step S408, the encoder factory 160 may select an encoder stored in the encoder storage 140 and then generate an encoder instance, using information about the type of data to be encoded and an encoding rule, provided by the encoding rule storage 120, as arguments. That is, since the type of data to be encoded is a structure, the encoder factory 160 may select the structure-type encoder 143 and generate an encoder instance. The encoder instance generated by the encoder factory 160 is provided to the encoder unit 180.

Thereafter, in step S410, encoding is performed. The encoder unit 180 may generate encoded data by performing encoding using the structure-type encoder and the meta structure generated by the meta structure converter, and then send the encoded data to the decoding apparatus of a reception apparatus. Here, encoding rule information may be added to the encoded data.

Although in this embodiment of the present invention, the encoding rule information has been described as being included in the data to be encoded by way of example, the encoding rule information may not be included in the encoded data but may be sent to the reception apparatus separately from the encoded data.

On the other hand, if it is determined that the type of data to be encoded is a primitive type or an array type in step S404, the encoder factory 160 may select the primitive-type encoder 141 or array-type encoder 142 from the encoder storage 140 and generate an encoder instance in step S412, and then provides the encoder instance to the encoder unit 180.

Thereafter, the encoder unit 180 may generate encoded data by performing encoding using the data to be encoded directly as an argument, and then send the encoded data to the reception apparatus.

The encoded data generated by the above-described encoding apparatus may be sent to the reception apparatus, that is, the decoding apparatus, and then be decoded.

A decoding apparatus in accordance with an embodiment of the present invention and the operation thereof will now be described with reference to FIGS. 5 to 7.

Figure 5:
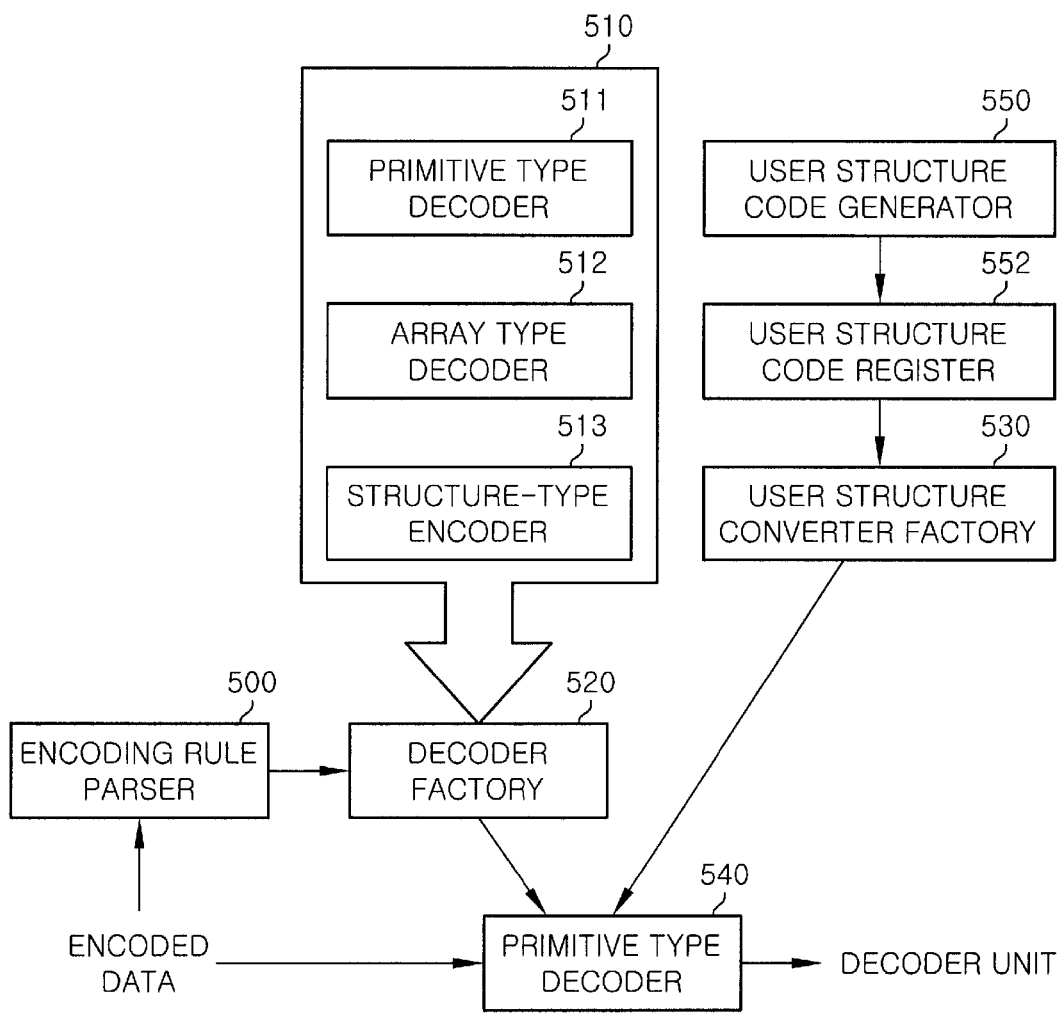
FIG. 5 is a block diagram showing the internal configuration of a decoding apparatus in accordance with the embodiment of the present invention.

FIG. 5 is a block diagram showing the internal configuration of the decoding apparatus in accordance with the embodiment of the present invention.

Referring to FIG. 5, the data decoding apparatus in accordance with the embodiment of the present invention may include an encoding rule parser 500 for extracting an encoding rule by interpreting encoded data, decoder storage 510 for storing a plurality of decoders, a decoder factory 520 for selecting a decoder from the decoder storage 510 based on information about the type of user data, a user structure converter factory 530 for generating a user structure converter for converting a meta structure into user structure data when the type of data to be decoded is a structure or a structure array, and a decoder unit 540 for generating user data by decoding encoded data.

The user structure converter factory 530 may allow one or more user structure converters that were generated based on an information file regarding one or more data structures to be registered therein. If information about the type of user data to be decoded is a structure or a structure array, a meta structure converter may be selected from among the meta structure converters and then be provided to the decoder unit 540. Here, each of the user structure converters is used to convert a meta structure into a user data structure. The user structure converters may convert a meta structure, such as that shown in FIG. 2, into a user structure.

Meanwhile, the user structure converters registered in the user structure converter factory 530 may be generated and registered by the user structure code generator 550 and the user structure code register 552.

The user structure code generator 550 may generate a user structure converter from an information file as the information file regarding a data structure defined by the user is input. The user structure converter generated by the user structure code register 552 may be registered in the user structure converter factory 530.

The user structure converter generated by the user structure code generator 550 may be implemented in the form of code, as shown in FIG. 6. That is, the user structure converter may include a converter function code 600 for converting a meta structure into a user data structure and a registration code 610 for registering the converter function code 600.

In this embodiment of the present invention, the decoder storage 510 may store a primitive type decoder 511, an array type decoder 512, and a structure-type encoder 513.

The decoder factory 520 may search for a decoder to be used from the decoder storage 510 by using the encoding rule information provided by the encoding rule parser 500 and the information about the type of user data as arguments, select the decoder, and provide the decoder to the decoder unit 540. That is, if the type of encoded user data is a primitive type, the primitive type decoder 511 may be selected and generated. If the type of user data is an array type, the array type decoder 512 may be selected and generated. If the type of user data is a composite type such as a structure, the structure decoder 513 may be selected and provided to the decoder unit 540.

The decoder unit 540 may decode the encoded data using the decoder provided by the decoder factory 520. That is, if the type of encoded user data is a primitive type or an array type, the user performs decoding using the data as an argument. If the type of user data is a composite type such as a structure, user data may be generated by performing decoding using the user structure generated by the user structure converter.

A process in which the decoding apparatus configured as described above receives and decodes encoded data will now be described with reference to FIG. 7.

Figure 7:
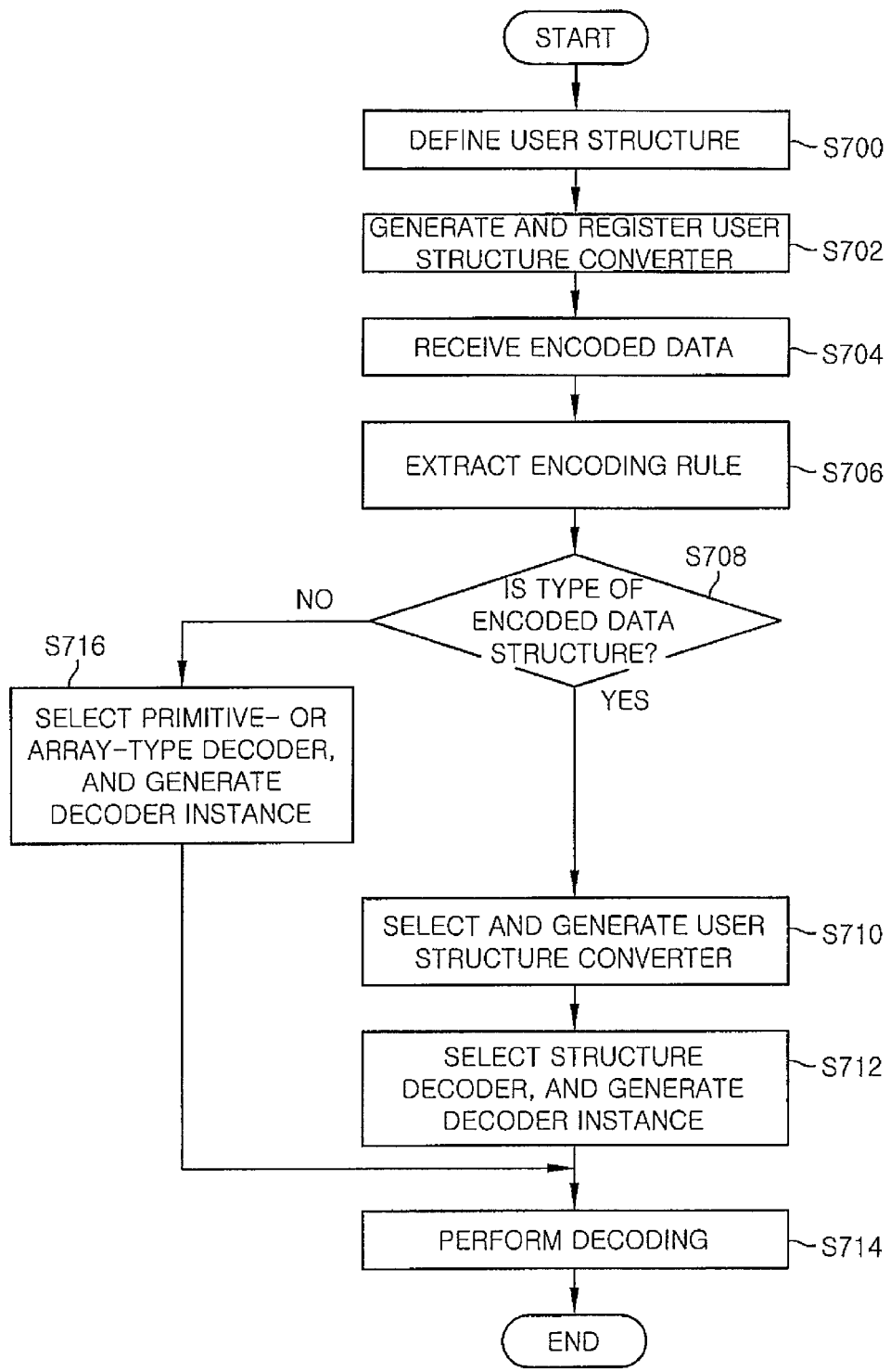
FIG. 7 is a flow chart showing the process of decoding encoded data in accordance with the embodiment of the present invention.

FIG. 7 is a flowchart showing the process of decoding encoded data according to an embodiment of the present invention.

As shown in FIG. 7, in step S700, a user may first define a data structure to be used for decoding using a user interface provided by the decoding apparatus. Accordingly, the user structure code generator 550 generates codes for a user structure converter while referring to an information file regarding a data structure defined using the user interface.

Thereafter, in step S702, prior to initiating decoding, the decoding apparatus calls the user structure code register 552 and registers the user structure converter for each type of data in the user structure converter factory 530.

Thereafter, in step S704, the decoding apparatus receives encoded data via a variety of communication channels, such as a socket, and a file. At this time, the decoding apparatus extracts a header or some other information, first checks whether the received data can be decoded, and then performs subsequent steps only on data that can be decoded.

In step S706, the encoding rule parser 500 may extract an encoding rule by interpreting the encoded data, and then provide the extracted encoding rule to the decoder factory 520.

Thereafter, in step S708, the decoding apparatus may determine whether the type of encoded data is a structure.

If it is determined that the type of encoded data is a structure in step S708, information about the structure of the encoded data is provided to the user structure converter factory 520, and the user structure converter factory 520 selects and generates a user structure converter that executes the function of converting the type of encoded data, that is, a meta structure, into a user structure in step S710. The generated user structure converter converts the type of encoded data into a user structure, and provides it to the decoder unit 540. In other words, the user structure converter converts the type of encoded data into the user structure in such a manner that the user structure converter incorporates the data value of each meta structure item of the meta structure item list of an encoded data structure instance (meta structure instance) into each piece of the member data of an user structure instance.

Thereafter, in step S712, the decoder factory 520 may select a decoder stored in the stored decoder storage 510 and generate a decoder instance, using the type of encoded data information and an encoding rule, provided by the encoding rule parser 500, as arguments. That is, since the type of encoded data is a structure, the decoder factory 520 may select the structure decoder 513 and generate the decoder instance. The decoder instance generated by the decoder factory 520 may be provided to the generated decoder unit 540.

Thereafter, in step S714, decoding is performed. The decoder unit 540 may generate decoded data by performing decoding using the structure decoder and the user structure generated by the user structure converter.

On the other hand, if it is determined that the type of encoded data is a primitive type or an array type in step S708, the decoder factory 520 may select the primitive-type encoder 511 or the array-type encoder 512 from the decoder storage 510 and generate a decoder instance in step S716, and then provides the decoder instance to the decoder unit 540.

Thereafter, the decoder unit 540 may perform decoding using the encoded data directly as an argument, thereby generating decoded data.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A data encoding apparatus for communicating between robot softwares, comprising:
    a meta structure converter factory configured to allow one or more meta structure converters generated based on an information file regarding one or more data structures to be registered therein, and if a type of user data for encoding is a structure or a structure array, select a meta structure converter, operable to convert a structure of the user data into a meta structure, from among the registered meta structure converters;
    an encoder factory configured to allow encoders for respective types of data to be registered, and to select an encoder from among the registered encoders in order to encode the user data to be encoded; and
    an encoder unit configured to encode the user data to be encoded using the meta structure generated by the selected meta structure converter and the selected encoder.

2. The data encoding apparatus of claim 1, wherein the encoding apparatus further comprising:
    a meta structure code generator configured to generate the meta structure converters based on the information file; and a meta structure code register configured to register the meta structure converters generated by the meta structure code generator in the meta structure converter factory.

3. The data encoding apparatus of claim 1, wherein the encoder factory allows an array-type encoder operable to encode array type data and a structure-type encoder operable to structure type data to have been registered therein.

4. The data encoding apparatus of claim 1, wherein:
the encoding apparatus further comprises encoding rule storage configured to encode rule information that is used when the user data to be encoded is encoded; and
the encoder factory selects the encoder based on the type of user data to be encoded and the encoding rule information provided by the encoding rule storage.

5. The data encoding apparatus of claim 4, wherein the encoder unit adds the encoding rule information provided by the encoding rule storage to the encoded user data, and sends the resulting data to some other apparatus.

6. A data encoding method for communicating between robot softwares, comprising:
generating one or more meta structure converters based on an information file regarding one or more data structures, and registering the meta structure converters in a meta structure converter factory;
if a type of user data to be encoded is a structure or a structure array, converting a structure of the user data to be encoded into a meta structure using one of the meta structure converters registered in the meta structure converter factory;
selecting a structure-type encoder from at least one or more previously registered encoders; and
encoding the user data to be encoded using the structure-type encoder and the obtained meta structure.

7. The data encoding method of claim 6, further comprising, if the type of user data to be encoded is not a structure or a structure array, encoding the user data to be encoded using a primitive-type encoder or an array-type encoder.

8. The data encoding method of claim 6, wherein said encoding the user data to be encoded is performed such that the user data is provided by encoding rule storage, and an encoder is selected from the registered encoders based on the provided encoding rule information and the type of user data to be encoded.

9. The data encoding method of claim 8, further comprising adding the encoding rule information provided by the encoding rule storage to the encoded data, and sending the resulting data to some other apparatus.

10. A decoding apparatus for communicating between robot softwares, comprising:
a user structure converter configured to allow one or more user structure converters based on an information file regarding one or more factory data structures to be registered therein, and to, if a type of encoded data is a structure or a structure array, select a user structure converter, operable to convert a meta structure of encoded data into a user structure, from among the registered user structure converters;
a decoder factory configured to allow decoders to be registered for respective types of data, and to select a decoder from the registered decoders in order to decode the encoded data; and
a decoder unit configured to decode the encoded data using a user structure generated by the selected user structure converter and the selected decoder.

11. The decoding apparatus of claim 10, wherein the decoding apparatus further comprising:
a user structure code generator configured to generate the user structure converters based on the information file; and
a user structure code register configured to register the user structure converters generated by the user structure code generator in the user structure converter factory.

12. The decoding apparatus of claim 10, wherein the decoder factory allows an array type decoder operable to decode array type data and a structure decoder operable to decode structure type data to have been registered therein.

13. The decoding apparatus of claim 10, wherein:
the decoding apparatus further comprises an encoding rule parser configured to extract encoding rule information included in the encoded data; and
the decoder factory selects the decoder based on the type of encoded data and the encoding rule information provided by the encoding rule parser.

14. A data decoding method for communicating between robot softwares, comprising:
generating one or more user structure converters based on an information file regarding one or more data structures, and registering the user structure converters in a user structure converter factory;
if a type of encoded data is a structure or a structure array, converting a meta structure of the encoded data into a user structure using one of the user structure converters registered in the user structure converter factory; and
selecting a structure decoder from among one or more registered decoders.

15. The data decoding method of claim 14, further comprising, if the type of encoded data is not a structure or a structure array, decoding the encoded data using a primitive type decoder or an array type decoder.

16. The data decoding method of claim 14, further comprising:
extracting encoding rule information from the encoded data; and
selecting a decoder from among the registered decoders based on the extracted encoding rule information and the type of encoded data.

* * * * *